United States Patent
Bravenec et al.

(10) Patent No.: US 8,660,805 B2
(45) Date of Patent: Feb. 25, 2014

(54) METHOD AND SYSTEM FOR CHARACTERIZING A PLASMA

(75) Inventors: Ronald Victor Bravenec, Austin, TX (US); Jianping Zhao, Austin, TX (US)

(73) Assignee: Tokyo Electron Limited (JP)

(*) Notice: Subject to any disclaimer, the term of this patent is extended or adjusted under 35 U.S.C. 154(b) by 316 days.

(21) Appl. No.: 13/252,988

(22) Filed: Oct. 4, 2011

(65) Prior Publication Data
US 2012/0084026 A1    Apr. 5, 2012

Related U.S. Application Data

(60) Provisional application No. 61/389,696, filed on Oct. 4, 2010.

(51) Int. Cl.
*G01R 15/00* (2006.01)

(52) U.S. Cl.
USPC .......................................................... 702/57

(58) Field of Classification Search
USPC .......................................................... 702/57
See application file for complete search history.

(56) References Cited

PUBLICATIONS

Announcement of the presentation of Ronald Bravenec, Jianping Zhao, Lee Chen, and Merritt Funk, entitled "A Physics-Based Procedure for Analyzing Langmuir Probe Data", at the 63rd Annual Gaseous Electronics Conference in Paris, France; the presentation was made on Oct. 5, 2010.
Abstract of the presentation of Ronald Bravenec, Jianping Zhao, Lee Chen, and Merritt Funk, entitled "A Physics-Based Procedure for Analyzing Langmuir Probe Data", at the 63rd Annual Gaseous Electronics Conference in Paris, France; the presentation was made on Oct. 5, 2010.
Chen F., "Langmuir probe analysis for high density plasmas", Physics of Plasmas, V 8, N 6, pp. 3029-3041, Jun. 2001.
Woods C. R. and Sudit I., "Theory of electron retardation by Langmuir probes in anisotropic plasmas", Physical Review E, V 50, N 3, pp. 2222-2240, Sep. 2004.
Siry M., Husarik J., and Masashi K., "Spatial investigation of the electron energy distribution function of the high-energy electron beam sustained in the low-pressure microwave surface-wave plasma", Applied Physics Letters, V 91, 071501-071501-3, 2007.

*Primary Examiner* — Stephen Cherry (57) ABSTRACT

Disclosed are a method and system for measuring the electron energy distribution function (EEDF) in a plasma which has a pronounced drifting Maxwellian component of the EEDF. The method comprises fitting an acquired unfiltered electron current vs. bias voltage curve to a functional form which assumes an EEDF comprising at least one stationary Maxwellian component and at least one drifting Maxwellian component. The method and system allow more accurate characterization of plasmas with electron components with pronounced drift, such as plasmas in microwave surface wave plasma (SWP) sources.

20 Claims, 7 Drawing Sheets

METHOD AND SYSTEM FOR CHARACTERIZING A PLASMA

CROSS REFERENCE TO RELATED APPLICATIONS

This application is based on and claims the benefit of and priority to U.S. Provisional Patent Application No. 61/389,696, entitled "METHOD FOR LANGMUIR PROBE ANALYSIS", filed on Oct. 4, 2010, the entire contents of which are herein incorporated by reference.

BACKGROUND OF THE INVENTION

1. Field of the Invention

The present invention relates to a method and system for processing current and voltage data acquired from an electric probe, such as a Langmuir probe, during investigation of a plasma, such as a plasma in a semiconductor processing apparatus. More specifically, the disclosed method is suitable for processing current and voltage data acquired in a plasma with a pronounced drifting Maxwellian component of the electron energy distribution function (EEDF).

2. Description of Related Art

Electric probes, such as Langmuir probes, retarding field analyzers, etc., are extensively used in diagnostics of plasmas, such as plasmas used in semiconductor processing. In semiconductor processing, plasmas can be used, for example, for etching and deposition. Data typically acquired from electric probes include the plasma density, average electron temperature, the electron energy distribution function (EEDF), and other properties of the plasma. All of these properties are useful both during development of a semiconductor processing tool, as well as during its use for actual semiconductor processing. For example, having EEDF data available allows tuning of both the geometry of a plasma source, and the process conditions such as the pressure, gas flows, temperatures, RF or microwave power applied to the plasma, etc., so as to achieve desired etch or deposition process results.

Some plasma sources commonly used in semiconductor processing, such as microwave surface wave plasma (SWP) sources, and in particular the microwave radial line slotted antenna (RLSA) plasma source, exhibit a bimodal EEDF, which is composed of a stationary Maxwellian component and a drifting (i.e. beam) Maxwellian component. In the case of an RLSA plasma source, this drifting (i.e. beam) Maxwellian component of the EEDF is particularly pronounced in the vicinity of the microwave launcher structure which is used to couple microwave power to the plasma. Farther away from the microwave launcher structure, the drifting Maxwellian component of the EEDF largely disappears, and only the stationary Maxwellian component of the EEDF remains.

Commonly used methods of processing current and voltage data acquired from electric probes involve making an assumption about the nature of the EEDF of the plasma whose properties are being measured. For example, data processing methods used by commercial electric probe vendors typically assume that the EEDF comprises one or more stationary Maxwellian components, i.e. they assume there is no drift in the plasma. When such data processing methods are used in a plasma with a pronounced drifting Maxwellian component, the acquired EEDFs suffer from low accuracy and the average electron temperature (i.e. average electron energy) is usually measured as higher than the actual average electron temperature. This is a result of the energy contribution from the drifting Maxwellian component of the EEDF being incorporated into a stationary Maxwellian component, artificially increasing the average electron temperature of the stationary Maxwellian component, and thus yielding erroneous measurement results.

Therefore, there exists a need for a method and system for accurately measuring EEDFs in plasmas with a pronounced drifting Maxwellian component, or a plurality of drifting Maxwellian components. Ideally, the method and system would separately measure the average electron temperatures associated with any stationary and drifting Maxwellian components of the EEDF, and would also accurately measure the drift velocities (i.e. drift energies) of all drifting Maxwellian EEDF components.

SUMMARY OF THE INVENTION

The present invention relates to a method and system for processing electric probe current and voltage data acquired in a plasma with a pronounced drifting Maxwellian component of the electron energy distribution function (EEDF).

According to an embodiment of the invention, disclosed is a system for measuring an electron energy distribution function (EEDF) of a plasma, comprising: a probe, comprising an elongated probe body and a probe tip; a sweeping voltage source in electrical communication with the probe tip, for applying a bias voltage to the probe tip; a data acquisition device in electrical communication with the probe tip, for measuring the current flowing from the plasma to the probe tip, in response to the bias voltage; and a data processing device, in communication with the data acquisition device, wherein the data processing device is configured to determine an unfiltered electron current vs. bias voltage curve from the measured unfiltered current vs. bias voltage curve, and further to determine the electron energy distribution function (EEDF) of the plasma by performing a curve fit to the unfiltered electron current vs. bias voltage curve, wherein the electron energy distribution function (EEDF) comprises one drifting Maxwellian term.

According to a further embodiment of the invention, disclosed is a method of measuring an electron energy distribution function (EEDF) of a plasma, comprising: generating the plasma in a plasma source; positioning a probe tip within the plasma; sweeping an applied bias voltage of the probe tip; measuring an unfiltered current vs. bias voltage curve at the probe tip; determining an unfiltered electron current vs. bias voltage curve from the measured unfiltered current vs. bias voltage curve; and determining an electron energy distribution function of the plasma from a curve fit to the unfiltered electron current vs. bias voltage curve, wherein the electron energy distribution function comprises one drifting Maxwellian term.

According to yet a further embodiment of the invention, disclosed is a method of measuring electron energy distribution functions (EEDF) at multiple points in a plasma, by repeating the aforementioned method steps at multiple points in a plasma, by repositioning the probe tip and measuring the electron energy distribution function (EEDF) at each probe tip position.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EXEMPLARY EMBODIMENTS

In the following description, in order to facilitate a thorough understanding of the invention and for purposes of explanation and not limitation, specific details are set forth, such as particular geometries of plasma sources, electric probes, and descriptions of various components and processes. However, it should be understood that the invention may be practiced in other embodiments that depart from these specific details.

In the description to follow, the term substrate, which represents the workpiece being processed, may be used interchangeably with terms such as semiconductor wafer, LCD panel, photovoltaic device panel, etc., the processing of all of which falls within the scope of the claimed invention.

Figure 1:
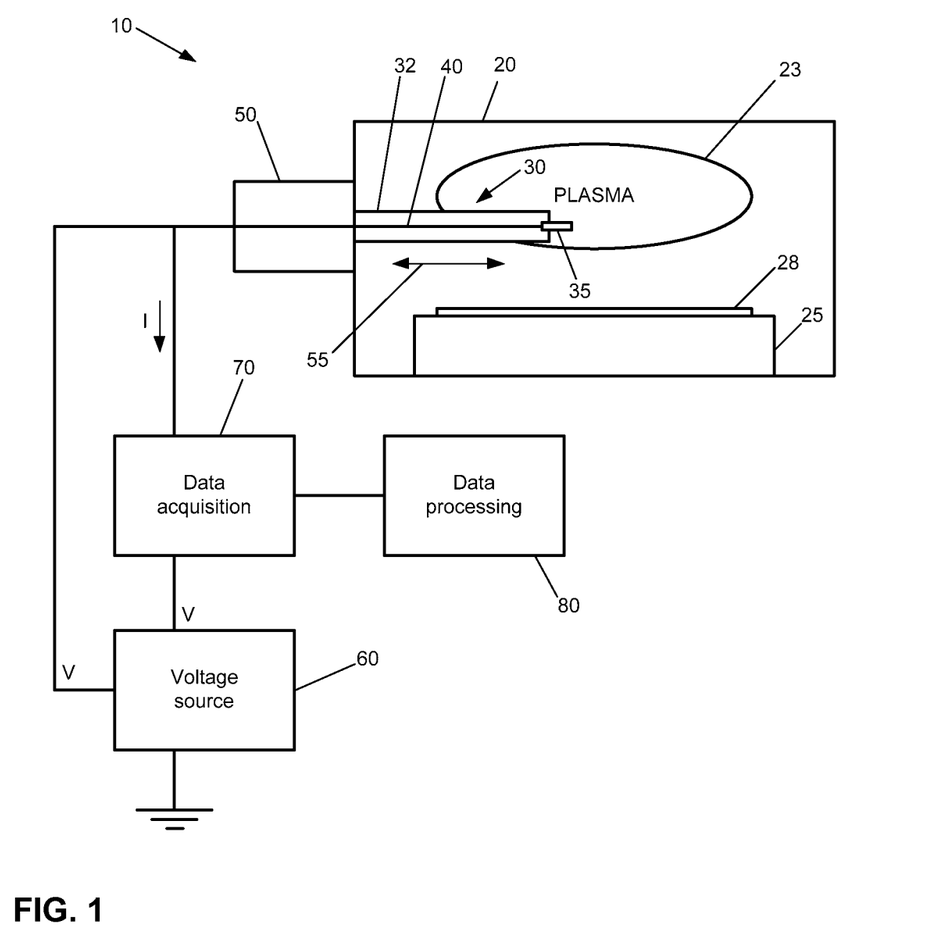
FIG. 1 shows an embodiment of a system for measuring the electron energy distribution function (EEDF) of a plasma.

FIG. 1 shows an embodiment of a measurement system 10, for measuring properties of a plasma. Measurement system 10 comprises a plasma source 20 configured to enclose a plasma 23, whose properties are to be measured. The plasma source can be an inductive-coupled plasma source (ICP), a capacitive-coupled plasma source (CCP), a microwave surface wave plasma (SWP) source, a microwave radial line slotted antenna (RLSA) source, a Helicon plasma source, etc.

An electric probe 30, for example, a Langmuir probe, is mounted inside plasma source 20 to measure properties of the plasma 23. The electric probe 30 comprises a probe body 32 and a probe tip 35. The probe body 32 is typically made of dielectric material, such as quartz, while the probe tip 35 is made of metal exhibiting good electrical conductivity and resistance to high temperatures which the probe tip 35 may be subjected to during operation inside plasma 23. Example materials for the probe tip 35 include tungsten and molybdenum, but other materials such as graphite can also be used. The probe tip 35 and probe body 32 are mounted in such a way that the probe tip 35 samples the plasma 23 at a position where plasma properties are sought. Using a feedthrough 50 which allows the probe body 32 to be moved in and out of the plasma 23 (indicated by arrows 55), and possibly also laterally to the axis of the probe body 32 (not shown), the probe tip 35 can be located at various positions in the plasma 23, such that variations of the properties of the plasma 23 across plasma source 20 can be mapped-out.

The probe tip 35 is electrically connected to conductor 40, which transmits the current I collected by the probe tip 35 from plasma 23, to a data acquisition system 70. A voltage source 60 is used to bias the probe tip 35 via conductor 40, to a selected bias voltage V. Bias voltage V is typically swept (i.e. varied) by the voltage source 60 in a triangular, or similar waveform pattern, between selected minimum and maximum bias voltages which enclose a range of bias voltages over which the current I from the plasma to the probe tip 35 is measured. Data acquisition system 70 is configured to acquire the bias voltage V and corresponding plasma current I in the form of a current vs. bias voltage curve, i.e. I-V curve, and provides this data to a data processing system 80, which is configured to calculate plasma properties from the measured current vs. bias voltage curve. An example of a measured I-V curve is shown in FIG. 2C, as I-V curve 310 (indicated by a dotted line, to distinguish from a fitted I-V curve 320).

While FIG. 1 shows the feedthrough 50 and electric probe 30 mounted horizontally, which allows the use of the electric probe 30 during processing of a substrate 28 positioned atop substrate holder 25 located inside plasma source 20, it is understood that the probe assembly can be mounted in other positions. For example, feedthrough 50 and electric probe 30 can be mounted vertically at the bottom wall of plasma source 20. In this configuration, the electric probe 30 can be used to accurately sample plasma properties in the vicinity of the top wall of plasma source 20. It is further understood that multiple probes can be used in accordance with the invention, in any of the aforementioned positions, to allow complete mapping of the plasma properties across plasma source 20.

With reference now to FIGS. 2A-2D, a method of calculating an electron energy distribution function (EEDF) from an I-V curve measured by, for example, measurement system 10, will be described in detail.

Figure 2A:
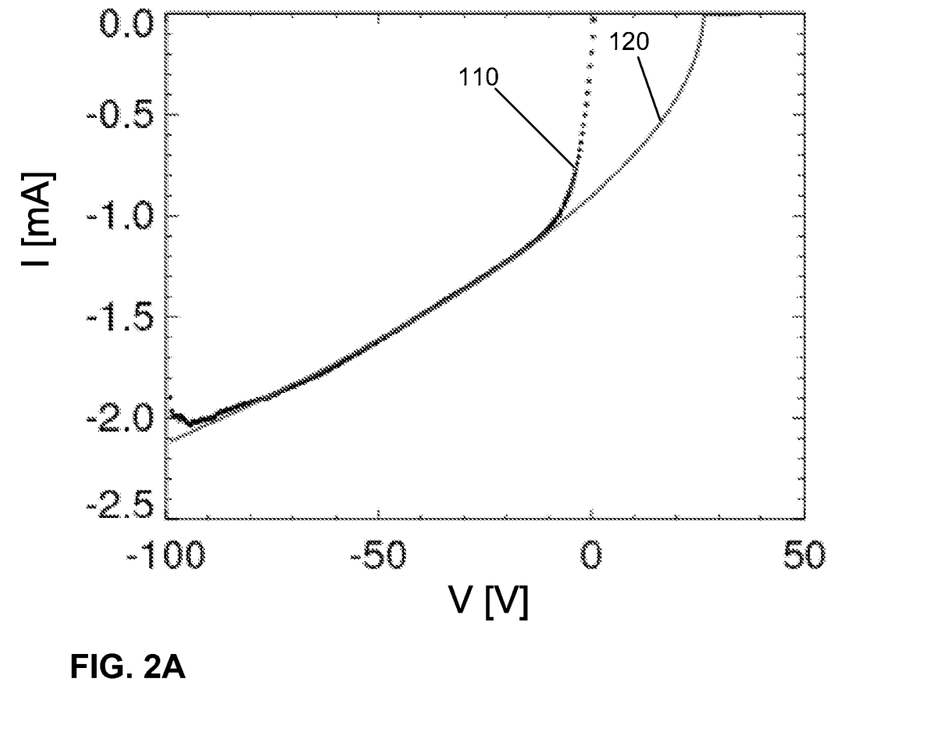
FIG. 2A shows an exemplary measured total current for bias voltages lower than the floating potential, and an ion current vs. bias voltage curve fit, in accordance with an embodiment of the invention.
Figure 2B:
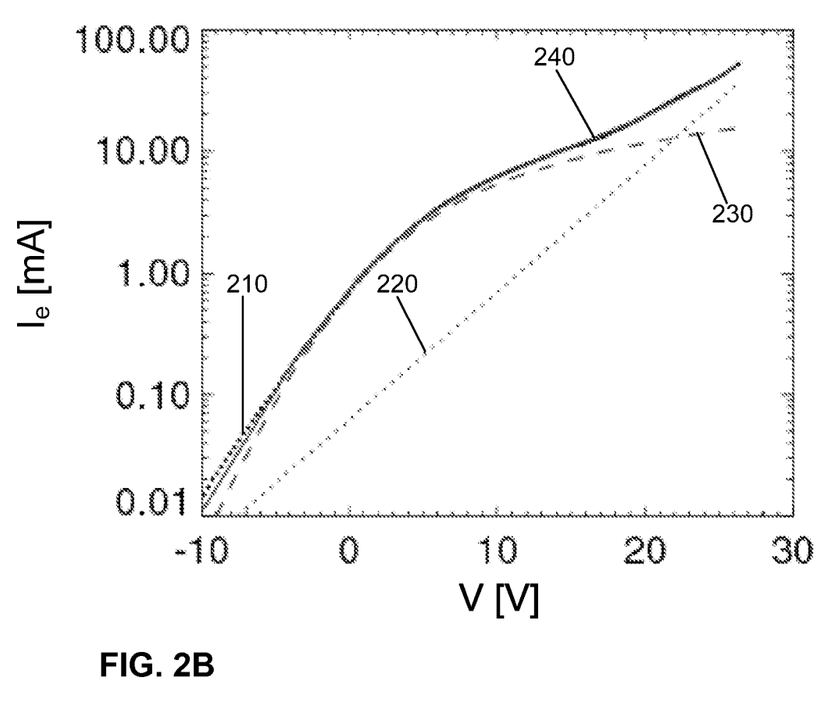
FIG. 2B shows an exemplary measured electron current, stationary Maxwellian electron current and drifting Maxwellian electron current curve fits vs. the bias voltage, and the total electron current vs. bias voltage curve fit, in accordance with an embodiment of the invention.
Figure 2C:
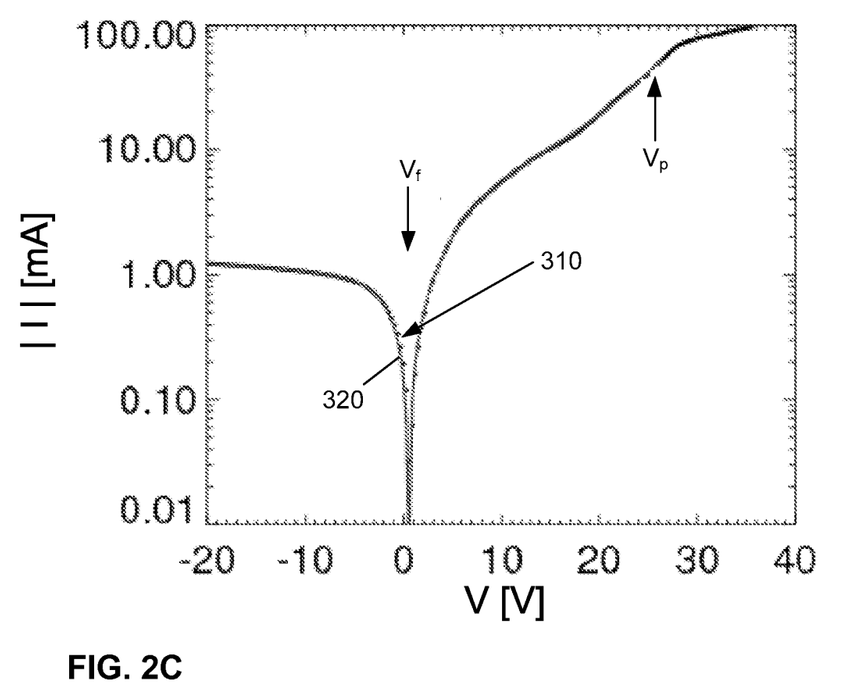
FIG. 2C shows an exemplary measured total electric probe current vs. bias voltage curve, and the total current vs. bias voltage curve fit, in accordance with an embodiment of the invention.

Referring now to FIG. 2C, I-V curve 310 shows the absolute value of the current I flowing into probe tip 35 from plasma 23, as a function of bias voltage V generated by a voltage source, for example voltage source 60 of measurement system 10 of FIG. 1. I-V curve 310 may be measured by data acquisition system 70 of measurement system 10, of FIG. 1, for example. The total current I consists of contributions from ions and electrons in the plasma, where $I_i$ is the ion current, and $I_e$ is the electron current. Generally, at negative bias voltages, electrons from the plasma are repelled by the negatively-biased probe tip 35, and the total current I is dominated by the ion current $I_i$, which saturates at very large negative bias voltages.

As can be further seen from FIG. 2C, at some low bias voltage V, a point is reached where the ion and electron currents, $I_i$ and $I_e$, are equal, i.e. an equal number of ions and electrons reach the probe tip 35, per unit time, causing the total current I to drop to zero. The bias voltage at which the total current I is zero, is called the floating potential $V_f$, and is indicated in FIG. 2C.

On the far right end of the I-V curve 310, the total current I is dominated by the electron current $I_e$, which can reach very large values due to the large mobility of electrons, compared to ions. At this end of the graph, in accordance with an embodiment of the invention, the plasma potential $V_p$ (indicated in the graph) is estimated as a point at which the derivative dI/dV reaches a maximum value.

Further calculations, in accordance with an embodiment of the invention, proceed by separately curve-fitting the ion current $I_i$ and the electron current $I_e$. FIG. 2A shows the total current I plotted in the region where bias voltages satisfy $V \leq V_f$. Over the plotted range of bias voltages V, the total current I is dominated by the ion current $I_i$, allowing one to separately curve fit the ion current $I_i$ from the electron current $I_e$. The method proceeds by performing a nonlinear curve fit of the form $$I = C(V_p - V)^p$$

to the total current I, here assumed to be dominated by, i.e. equal to the ion current $I_i$, over the bias voltage range $V \ll V_p$. In the curve fit, C and p are fit constants. Nonlinear curve fitting methods are well known to persons skilled in the art, and any suitable fitting method can be used to determine fit constants C and p, such as, for example, nonlinear least squares fitting. I-V curve 120 in FIG. 2A shows the fitted ion current $I_i$ as a function of bias voltage V. In the example presented here, the values of fit constants are C=−0.15 and p=0.55. Having now curve-fitted the ion current $I_i$, the method further proceeds by subtracting the fitted ion current $I_i$ from the measured total current I, to yield the electron current, i.e. $I_e = I - I_i$.

As was discussed before, in typical applications, and particularly in current commercial plasma measurement system implementations, an assumption is made that the electron velocity distribution function (EVDF) in a plasma is a stationary Maxwellian velocity distribution, i.e.

$$f_e(v) \propto e^{-m_e v^2 / 2kT_e},$$

where $m_e$ is the electron mass, v is the electron velocity, and $T_e$ is the electron temperature. In terms of electron energy, $\in$, the electron energy distribution function (EEDF) can be written as $$f_e(\in) \propto e^{-\in/T_e}.$$

Utilizing the Druyvesteyn relation $$f_e(\varepsilon) = \frac{2m_e}{e^2 A_p} \sqrt{\frac{2e\varepsilon}{m_e}} \frac{d^2 I_e}{dV^2}$$

which relates the EEDF $f_e(\in)$ to the second derivative of the electron current vs. bias voltage curve, i.e. $I_e(V)$, where $A_p$ is the probe tip area exposed to the plasma, and the electron energy is taken as $\in = V_p - V$, one can calculate the EEDF from the measured I-V curve data from which the previously fitted ion current data has been subtracted. This is done by numerically evaluating the second derivative of the measured electron current vs. bias voltage curve data, and substituting the second derivative data into the Druyvesteyn relation, to yield the EEDF $f_e(\in)$. If the quantity $$\ln\left[\varepsilon^{-\frac{1}{2}} f_e(\varepsilon)\right]$$

is linear when plotted against electron energy $\in$, the EEDF is, in fact, a stationary Maxwellian, or very close to being so, and the electron temperature $T_e$ can be evaluated from the slope of the plot, i.e.

$$T_e = -\left\{ \frac{d\left[\ln\left[\varepsilon^{-\frac{1}{2}} f_e(\varepsilon)\right]\right]}{d\varepsilon} \right\}^{-1}.$$

In practice, multiple linear regions may be identified in the plot, which means that the EEDF, in fact, comprises multiple stationary Maxwellians, and in most cases the above approach allows one to determine multiple electron temperatures $T_e$ of these multiple stationary Maxwellians by estimating $T_e$ using the above equation for each linear region separately. The biggest obstacles to a robust and widely applicable implementation of the above method lie in the evaluation of the second derivative of the I-V curve, present in the Druyvesteyn relation, and in the assumed form of the EEDF being a stationary Maxwellian (or a plurality thereof). Furthermore, the Druyvesteyn relation assumes that plasma is isotropic which is only true for a stationary Maxwellian plasma. In many plasma sources, like inductive-coupled plasma (ICP) plasma sources and radial line slotted antenna (RLSA) plasma sources, the plasma may not be isotropic.

Regarding evaluation of the second derivative of the I-V curve, because of measurement noise which may be present in the I-V curve data in some cases (e.g. at locations with low plasma density), typical applications involve extensive filtering and smoothing of the I-V curve data prior to evaluation of the second derivative, because evaluation of a second derivative of noisy (and thus fast-varying) data leads to an even noisier second derivative, and thus a noisy EEDF. Noisy EEDF data is undesirable because it typically leads to unreliable data in the higher energy part of the EEDF, e.g. at electron energies from 10 to 15 eV. Yet, in plasma sources, studying the region in which ionization occurs requires accurate measurements of the higher-energy portions of the EEDF because these higher-energy portions of the EEDF help one gain understanding of the physics of the plasma ionization process.

The second problem with these implementations is that even when an appropriate level of filtering is identified and used, and a smooth EEDF is obtained, the plotted EEDF data in some cases simply does not fit a straight line in the plot of the quantity $$\left[\varepsilon^{-\frac{1}{2}} f_e(\varepsilon)\right]$$

vs. electron energy $\in$, effectively preventing one from reliably estimating an electron temperature $T_e$. In this latter case, no amount of I-V curve data manipulation, such as filtering, can produce a better fit and cure the deficiencies associated with the incorrect underlying assumption that the EEDF comprises only a stationary Maxwellian, or a plurality thereof. In zones of intense ionization, in plasma sources such as the radial line slotted antenna (RLSA) plasma source, this deviation from linear behavior is very pronounced, necessitating an alternate approach to treating electron current data, which is going to be described now.

The method of calculating the EEDF from the electron current vs. bias voltage curve data according to an embodiment of the invention seeks to address both above problems. First, to address the issue of an unsatisfactory fit of the second derivative of the electron current, the electron velocity distribution function (EVDF) is from the outset assumed to comprise two terms: a stationary Maxwellian term and a drifting Maxwellian term, i.e.

$$f_e(v) \propto e^{-m_e v^2/2kT_e} + \gamma e^{-m_e(v-v_d)^2/2kT_d}.$$

In the above equation, $v_d$ is the drift velocity of the drifting EEDF component, $T_d$ is the drift electron temperature, or velocity spread, associated with the drifting motion of the drifting EEDF component, and $\gamma$ is a constant that determines the relative contributions of the two terms to the EVDF. The electron energy distribution function (EEDF) now becomes $$f_e(\varepsilon) = C\left(e^{-\varepsilon/T_e} + \gamma e^{-(\sqrt{\varepsilon} - \sqrt{\varepsilon_d})^2/T_d}\right),$$

where $\in_d$ is the drift electron energy, and both temperatures are expressed in energy units.

Second, to address the issue of calculating a second derivative of noisy electron current vs. bias voltage data for the purpose of substitution into the Druyvesteyn relation, the inventors have sought a way to avoid having to calculate any derivatives of the measured data. The improved method starts by first substituting the assumed EEDF $f_e(\in)$ with the stationary and drifting Maxwellian term, into the Druyvesteyn relation. Then, the Druyvesteyn relation is integrated twice over the bias voltage V, to eliminate the second derivative of the electron current vs. bias voltage. These two integrations are performed analytically to yield the following expressions relating the electron current $I_e$ to the electron energy $\in$ $$I_e(\varepsilon) = I_{Max} e^{-\frac{\varepsilon}{T_e}} + I_d \frac{\delta(\varepsilon, \alpha)}{\delta(0, \alpha)},$$

$$\delta(\varepsilon, \alpha) = (\alpha\varepsilon + \alpha^2 + 1)e^{-(\varepsilon-\alpha)^2} - \sqrt{\pi}\,\alpha\left(\varepsilon^2 - \alpha^2 - \frac{3}{2}\right)\mathrm{erfc}(\varepsilon - \alpha),$$

$$\alpha = \sqrt{\frac{\varepsilon_d}{T_d}}.$$

In the above equations, the five constants $I_{Max}$, $T_e$, $I_d$, $\in_d$, and $T_d$ are determined by performing a direct nonlinear fit of the measured unfiltered electron current vs. bias voltage data to the analytically-derived functional forms given in the above expressions derived by integration. Since the integration was performed analytically to yield the functional forms, no calculation of derivatives is required. Once the nonlinear curve fit of the electron current $I_e(\in)$, is performed, for example using a nonlinear least squares method, and the constants $T_e$, $\in_d$, and $T_d$ are known, they can be substituted into the assumed EEDF, where now only constants C and $\gamma$ remain undetermined. Constants C and $\gamma$ are determined from the following two conditions which the electron current must satisfy $I_e \to 0$ as $e \to \infty$, and $I_e \to I_{Max} + I_d$ as $\in \to 0$.

It should be noted here that this method is not only applicable to an EEDF comprising one stationary Maxwellian term and one drifting Maxwellian term, but to other types of EEDFs, as well. For example, if the plasma EEDF comprises two stationary Maxwellian terms, then the above fitting will lead to an EEDF with zero drift electron energy $\in_d$ and zero drift electron temperature $T_d$, provided there are indeed two distinct stationary Maxwellian terms in the EEDF. If, furthermore, there is only one stationary Maxwellian term present in the EEDF, then the constant $\gamma$ will be fit as zero, resulting in a single stationary Maxwellian term EEDF. This ability of the method to resolve varying types of EEDFs is particularly useful in plasmas which have strong drifting Maxwellian terms in the ionization zone; but once the electric probe is relocated away from the ionization zone, the plasma EEDFs start to behave either as single or dual stationary Maxwellian term EEDFs. The described method naturally handles all these types of EEDFs without the need for algorithm switching depending on the EEDF type.

Because the Druyvesteyn relation assumes an isotropic plasma, and the assumed form of the EEDF is isotropic, the obtained EEDF is necessarily also isotropic. Since cylindrical electric probes, i.e. probes in which the probe tip 35 is of a cylindrical shape can measure the plasma current only in the direction perpendicular to the probe axis, it is of interest now to determine the perpendicular electron velocity distribution function (EVDF) and the perpendicular electron energy distribution function (EEDF), which represent the final results of the method in accordance with an embodiment of the invention. The following equation relates the perpendicular EVDF to the already determined isotropic EVDF $$f_{e\perp}(v_\perp) = 2\int_{v_\perp}^{\infty} f_e(v) \frac{v\,dv}{\sqrt{v^2 - v_\perp^2}}.$$

Now, the perpendicular EEDF can be found from $$g_{e\perp}(\varepsilon_\perp) = \frac{2\pi e}{m_e} f_{e\perp}\left(\sqrt{\frac{2e\varepsilon_\perp}{m_e}}\right).$$

Evaluation of the above expressions readily allows the determination of the perpendicular EEDF.

Figure 2D:
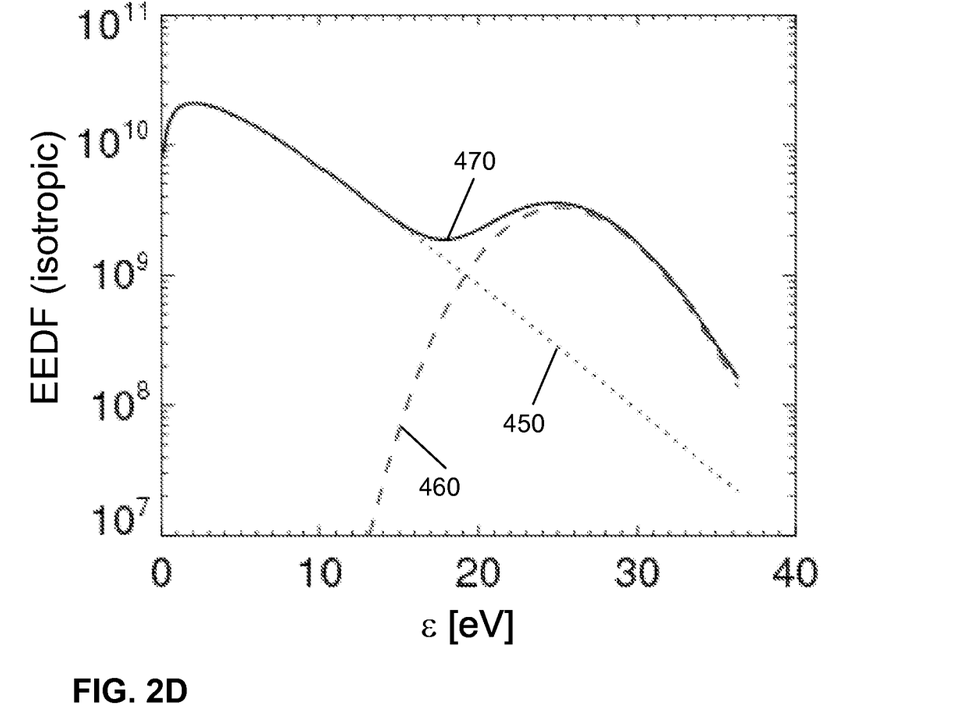
FIG. 2D shows an exemplary bimodal isotropic electron energy distribution function (EEDF) with a pronounced drifting Maxwellian component peak, calculated from a measured current vs. bias voltage curve, in accordance with an embodiment of the invention.

FIG. 2D shows a resulting isotropic EEDF calculated in accordance with the invention, for the same example data presented earlier in the foregoing description. Distribution function denoted by reference number 470 represents the total isotropic EEDF, i.e. the sum of the stationary Maxwellian term and the drifting Maxwellian term. Distribution functions 450 and 460 show the Maxwellian term and the drifting Maxwellian term, respectively, separately. In the example presented here, the fit constants were evaluated as $I_{Max}$=38.1 mA, $T_e$=4.13 eV, $I_d$=15.8 mA, $\in_d$=24.7 eV, and $T_d$=0.33 eV. It is clear from the above example that assuming an EEDF lacking a drifting Maxwellian component, in this case, would result in an erroneous estimate of both the shape of the EEDF (it would lack the peak due to drift), and the value of $T_e$ would have been overestimated as the drift term's contribution would have increased the electron temperature $T_e$ of the stationary Maxwellian term. The data in this example were obtained at a location in the intense ionization zone of a radial line slotted antenna (RLSA) plasma source, with relatively high plasma density, and therefore relatively little noise in the measured I-V curve data.

Figure 2E:
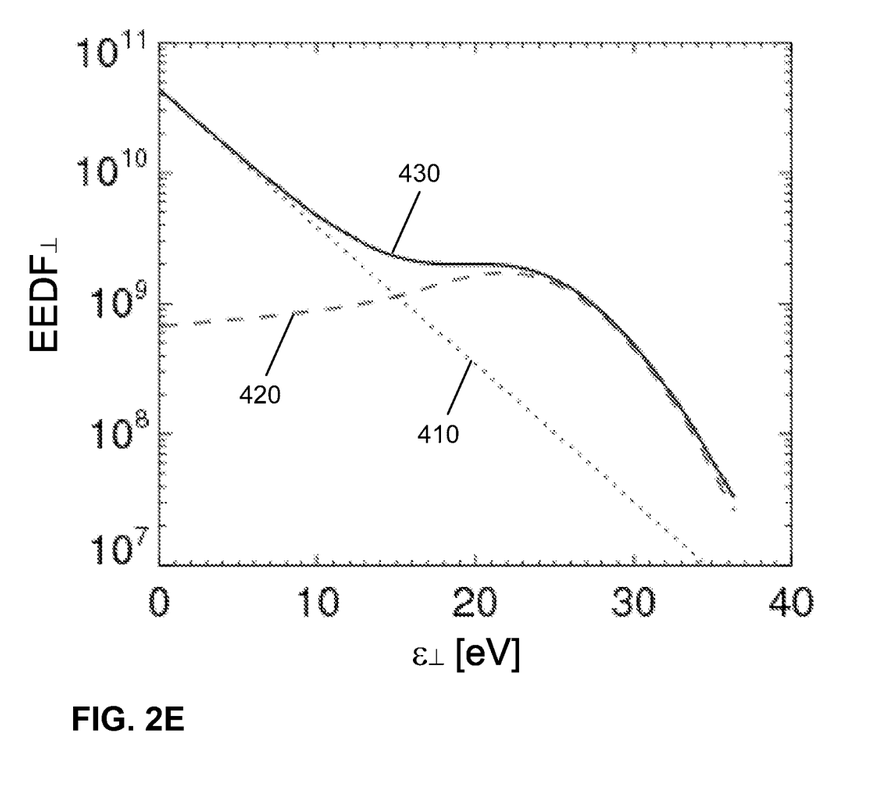
FIG. 2E shows an exemplary bimodal perpendicular electron energy distribution function (EEDF) with a pronounced drifting Maxwellian component peak, calculated from a measured current vs. bias voltage curve, in accordance with an embodiment of the invention.

FIG. 2E shows a resulting perpendicular EEDF calculated in accordance with the invention, for the same example data presented earlier in the foregoing description. Distribution function denoted by reference number 430 represents the total perpendicular EEDF, i.e. the sum of the stationary Maxwellian term and the drifting Maxwellian term. Distribution functions 410 and 420 show the Maxwellian term and the drifting Maxwellian term, respectively, separately. Like the isotropic EEDF 470, the perpendicular EEDF 430 also shows a pronounced peak at high electron energies, due to the drifting Maxwellian term.

FIG. 2B shows the unfiltered measured electron current $I_e$ in trace 210 (indicated with a heavy dotted line), which has been calculated by subtraction of the fitted ion current $I_i$ from the total measured current I. The total electron current $I_e$, fitted in accordance with an embodiment of the invention, is shown in trace 240. It is apparent from the quality of the data fit that the assumed form of the EEDF is valid, resulting in a very close fit. Separately evaluating the stationary Maxwellian contribution to the electron current results in linear trace 220 (i.e. in semi-log coordinates, indicated by a light dotted line), and evaluation of the drifting Maxwellian contribution to the electron current results in trace 230 (indicated by a dashed line). One can immediately see that the total electron current data does not conform to the straight line form of a stationary Maxwellian only, validating the choice of the two-term EEDF.

As was discussed before, FIG. 2C shows the measured unfiltered total current I vs. bias voltage V curve 310 (indicated with a dotted line). After determination of the electron current $I_e$ (and optionally the EEDF) in accordance with an embodiment of the invention, summing the fitted ion current $I_i$ and fitted electron current $I_e$, yields the fitted I-V curve 320 representing the total fitted current I vs. the bias voltage V. As in the case of electron current $I_e$ only (i.e. FIG. 2B), the quality of the total current fit is readily apparent.

In summary, the method in accordance with an embodiment of the invention, wherein the EEDF is assumed to be a sum of a stationary Maxwellian term and a drifting Maxwellian term, and in which the measured unfiltered electron current data is directly curve-fitted to a functional form derived analytically by twice integrating the Druyvesteyn relation with the assumed EEDF substituted, yields a very good fit to electric probe data measured in intense ionization regions of a plasma source. The method avoids calculation of derivatives of the measured electron current, thereby eliminating an additional source of noise in the EEDF, i.e. the numerical noise associated with derivative calculations.

The foregoing method can be also used with other types of EEDFs as long as it is possible to twice analytically integrate the Druyvesteyn relation with the assumed EEDF substituted therein. Once an analytical form is determined for the electron current vs. bias voltage curve, constants in the analytical form are determined by curve fitting, such as nonlinear least squares fitting. The EEDF and fitted electron current are determined by substitution of the fit constants back into the respective assumed EEDF and analytical form of the electron current, as described above.

Figure 3:
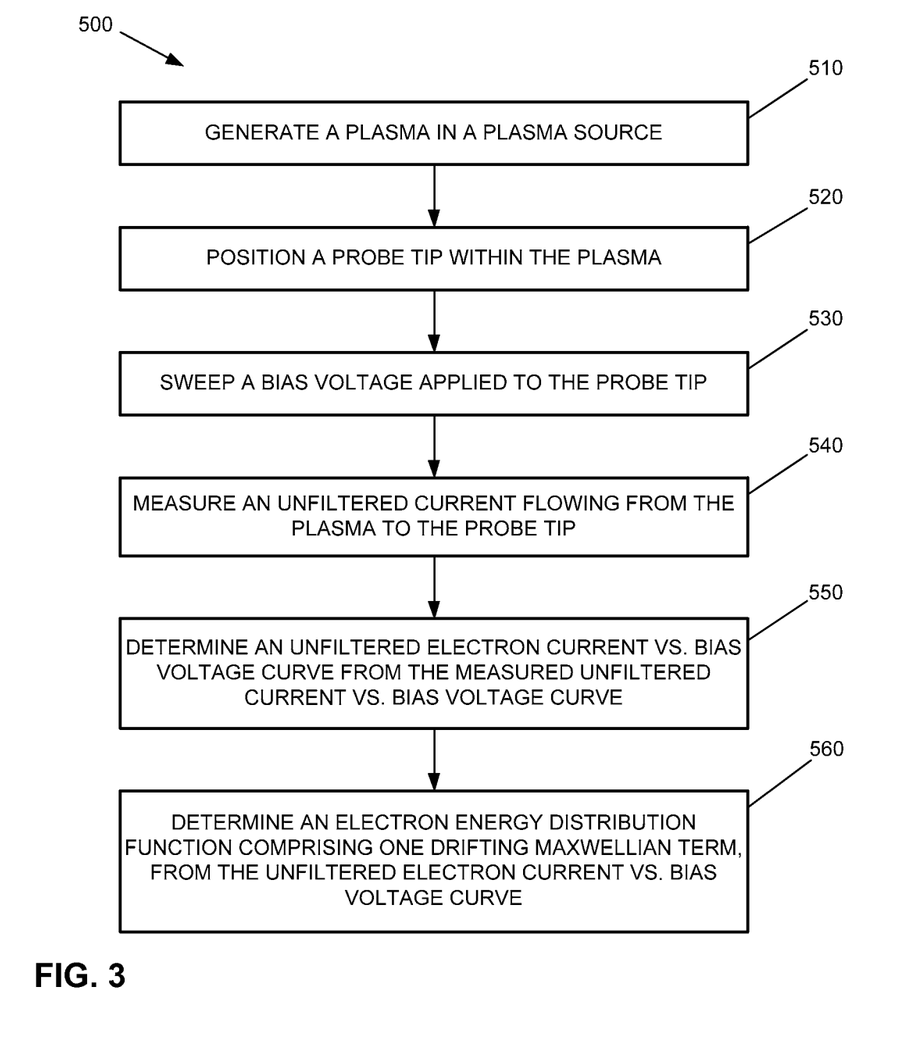
FIG. 3 shows a flowchart of a method for measuring an electron energy distribution function (EEDF) of a plasma with a drifting Maxwellian components, in accordance with an embodiment of the invention.

FIG. 3 shows a flowchart of the method of determining an EEDF of a plasma in accordance with an embodiment of the invention. The steps of the method do not necessarily have to be performed in the specified order. The method 500 starts at step 510, in which a plasma is created in a plasma source, such as for example, an inductive-coupled plasma (ICP) source, a capacitive-couple plasma (CCP) source, a surface wave plasma (SWP) source, a radial line slotted antenna (RLSA) plasma source, a Helicon plasma source, etc. In an embodiment of method 500, the plasma source can be the plasma source 20 of FIG. 1.

In step 520, a probe tip of an electric probe, such as probe tip 35 of electric probe 30 in FIG. 1, is positioned at a location in the plasma at which the EEDF of the plasma is to be measured.

In step 530, the bias voltage of the probe tip, e.g. probe tip 35 of FIG. 1, is swept across a range of bias voltages V, to enable collection of the plasma current I at different bias voltages, and creation of an I-V curve. The bias voltage can be provided by a voltage source, for example voltage source 60 of FIG. 1, which can be programmed by a controller, e.g. data processing system 80 of FIG. 1, to sweep the bias voltage V in the form of a triangular or similar waveform.

In step 540, the current I flowing from the plasma to the probe tip is measured using a data acquisition system, such as data acquisition system 70 of FIG. 1. The data acquisition system pairs the measured current I with the applied bias voltage V to create data points for the I-V curve, which are communicated to the data processing system 80.

In step 550, an unfiltered electron current $I_e$ is determined by subtraction of a fitted ion current $I_i$, from the as-measured unfiltered total current I determined in step 540.

In step 560, the calculated unfiltered electron current $I_e$ is fitted to a functional form analytically derived by twice integrating the Druyvesteyn relation with a substituted EEDF assumed to comprise one drifting Maxwellian term. The EEDF at the plasma location is now determined by substituting the fit constants into the assumed EEDF comprising one drifting Maxwellian term. In step 560, the fitted electron current $I_e$, and fitted total current I can also be determined by substitution of fit constants into the derived analytical form for the electron current $I_e$. Lastly, the fit constants readily provide the stationary Maxwellian and drift electron temperatures $T_e$ and $T_d$.

The step 560 can further include the substep of determining a perpendicular EEDF from the evaluated isotropic EEDF, as described before.

Steps of the method 500, starting with step 530 can be repeated multiple times after repositioning of the probe tip in the plasma, for example using feedthrough 50 controlled by data processing system 80 of measurement system 10 of FIG. 1. The data processing system 80 can send instructions to feedthrough 50, which comprises a motor capable of moving the probe body 32 to a new measurement location. Alternatively, the probe tip position can be adjusted manually, by the operator. It is understood that multiple probes mounted in a single or multiple separate feedthroughs can be controlled by data processing system 80, or manually, to facilitate fast scanning of a plasma source volume with sufficient resolution.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. A method of measuring an electron energy distribution function (EEDF) of a plasma, comprising:
    generating the plasma in a plasma source;
    positioning a probe tip within the plasma, at a first location;
    sweeping an applied bias voltage of the probe tip;
    measuring a first unfiltered current vs. bias voltage curve at the probe tip;
    determining a first unfiltered electron current vs. bias voltage curve from the measured first unfiltered current vs. bias voltage curve; and
    determining a first electron energy distribution function of the plasma from a curve fit to the first unfiltered electron current vs. bias voltage curve,
    wherein the first electron energy distribution function comprises one drifting Maxwellian term.

2. The method of claim 1, further comprising:
    repositioning the probe tip within the plasma, to a second location;
    sweeping an applied bias voltage of the probe tip;
    measuring a second unfiltered current vs. bias voltage curve at the probe tip;
    determining a second unfiltered electron current vs. bias voltage curve from the measured second unfiltered current vs. bias voltage curve; and
    determining a second electron energy distribution function of the plasma from a curve fit to the second unfiltered electron current vs. bias voltage curve,
    wherein the second electron energy distribution function comprises one drifting Maxwellian term.

3. The method of claim 1, wherein the probe tip is located at a first end of an elongated probe body, the second end of the elongated probe body being mounted in a positioning stage configured to adjust the position of the probe tip.

4. The method of claim 1, wherein the plasma source is a microwave surface wave plasma source.

5. The method of claim 1, wherein the plasma source is a capacitive-coupled plasma source.

6. The method of claim 1, wherein the plasma source is an inductively-coupled plasma source.

7. The method of claim 1, wherein the applied bias voltage is provided by a sweeping voltage source.

8. The method of claim 1, wherein the applied bias voltage waveform is a triangular waveform.

9. The method of claim 1, wherein the first electron energy distribution function comprises a stationary Maxwellian term and a drifting Maxwellian term.

10. The method of claim 2, wherein the second electron energy distribution function comprises a stationary Maxwellian term and a drifting Maxwellian term.

11. The method of claim 1, wherein the curve fit is a nonlinear least squares fit.

12. A method of measuring an electron energy distribution function (EEDF) of a plasma, comprising:
    generating the plasma in a plasma source;
    positioning a probe tip within the plasma;
    sweeping an applied bias voltage of the probe tip;
    measuring an unfiltered current vs. bias voltage curve at the probe tip;
    determining an unfiltered electron current vs. bias voltage curve from the measured unfiltered current vs. bias voltage curve; and
    determining an electron energy distribution function of the plasma from a curve fit to the unfiltered electron current vs. bias voltage curve,
    wherein the electron energy distribution function comprises one drifting Maxwellian term.

13. The method of claim 12, wherein the electron energy distribution function comprises a stationary Maxwellian term and a drifting Maxwellian term.

14. The method of claim 12, wherein the electron energy distribution function is an isotropic electron energy distribution function, further comprising:
    determining a perpendicular electron energy distribution function from the isotropic electron energy distribution function.

15. A system for measuring an electron energy distribution function (EEDF) of a plasma, comprising:
    a probe, comprising an elongated probe body and a probe tip;
    a sweeping voltage source in electrical communication with the probe tip, for applying a bias voltage to the probe tip;
    a data acquisition device in electrical communication with the probe tip, for measuring the current flowing from the plasma to the probe tip, in response to the bias voltage; and
    a data processing device, in communication with the data acquisition device,
    wherein the data processing device is configured to determine an unfiltered electron current vs. bias voltage curve from the measured unfiltered current vs. bias voltage curve, and further to determine the electron energy distribution function of the plasma by performing a curve fit to the unfiltered electron current vs. bias voltage curve,
    wherein the electron energy distribution function comprises one drifting Maxwellian term.

16. The system of claim 15, further comprising:
    a positioning stage to which the probe body is attached, configured to adjust the position of the probe tip within the plasma.

17. The system of claim 15, wherein the probe tip has a cylindrical shape.

18. The system of claim 15, wherein the bias voltage waveform applied to the probe tip is a triangular waveform.

19. The system of claim 15, wherein the electron energy distribution function comprises a stationary Maxwellian term and a drifting Maxwellian term.

20. The system of claim 15, wherein the curve fit is a nonlinear least squares fit.

* * * * *